(12) United States Patent
Perfecto et al.

(10) Patent No.: US 8,338,286 B2
(45) Date of Patent: Dec. 25, 2012

(54) DIMENSIONALLY DECOUPLED BALL LIMITING METALURGY

(75) Inventors: Eric David Perfecto, Hopewell Junction, NY (US); Harry David Cox, Poughkeepsie, NY (US); Timothy Harrison Daubenspeck, Essex Junction, VT (US); David L. Questad, Hopewell Junction, NY (US); Brian Richard Sundlof, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 12/897,826

(22) Filed: Oct. 5, 2010

(65) Prior Publication Data

US 2012/0083114 A1   Apr. 5, 2012

(51) Int. Cl.
  *H01L 21/44* (2006.01)
(52) U.S. Cl. ............... 438/613; 438/106; 257/E21.508
(58) Field of Classification Search ............... 438/106, 438/613, FOR. 343; 257/E21.508
  See application file for complete search history.

(56) References Cited

U.S. PATENT DOCUMENTS

| | | | |
|---|---|---|---|
| 5,937,320 A | | 8/1999 | Andricacos et al. |
| 6,111,317 A | | 8/2000 | Okada et al. |
| 6,426,176 B1 | * | 7/2002 | Danielson et al. ............ 430/315 |
| 6,476,491 B2 | | 11/2002 | Harada et al. ................ 257/758 |
| 6,613,663 B2 | * | 9/2003 | Furuya ......................... 438/613 |
| 6,867,123 B2 | * | 3/2005 | Katagiri et al. ............... 438/614 |
| 7,122,459 B2 | * | 10/2006 | Feng ............................ 438/613 |
| 7,126,164 B2 | | 10/2006 | Johnson et al. |
| 7,239,025 B2 | | 7/2007 | Farrar |
| 7,465,653 B2 | | 12/2008 | Huang et al. |
| 7,473,998 B2 | | 1/2009 | Tsai |
| 7,846,830 B2 | * | 12/2010 | Takewaki et al. ............. 438/614 |
| 2005/0069782 A1 | | 3/2005 | Elenius et al. |
| 2006/0278984 A1 | | 12/2006 | Yamada |
| 2007/0001301 A1 | | 1/2007 | Wang |
| 2007/0018322 A1 | | 1/2007 | Park et al. |
| 2008/0150134 A1 | * | 6/2008 | Shinkai et al. ................ 257/737 |
| 2008/0169539 A1 | | 7/2008 | Fang et al. |
| 2009/0298277 A1 | * | 12/2009 | MacKay et al. .............. 438/613 |
| 2010/0019347 A1 | | 1/2010 | McLellan et al. |
| 2010/0096744 A1 | | 4/2010 | Mori et al. |
| 2010/0099222 A1 | | 4/2010 | Pendse et al. |

FOREIGN PATENT DOCUMENTS

JP   2008-172232   7/2008

OTHER PUBLICATIONS

Yuan Lin Tzeng, et al; Stress Studies to Optimize the FCBGA Bumping Structure; Electronic Materials and Packaging, EMAP 2006 International Conference; Dec. 11-14, 2006, Kowloon.

Sriram Muthukumar, et al; High-Density Compliant Die-Package Interconnects; Electronic Components and Technology Conference, 2006, San Diego.

Silicon ILD Crack Moat; Disclosed Anonymously; IPCOM000146440D; Feb. 13, 2007.

C4 Bumps with an Encapsulated Polymer Composite as a Stress Protection in First Layer Interconnects; Disclosed Anonymously; IPCOM000135689D; Apr. 22, 2006.

* cited by examiner

*Primary Examiner* — Michelle Mandala
(74) *Attorney, Agent, or Firm* — Howard M. Cohn; Katherine S. Brown

(57) ABSTRACT

A method for reducing stress on under ball metallurgy (UBM) is disclosed. A collar is disposed around the ball to provide support, and prevent solder interaction in the undercut areas of the UBM. In one embodiment, the collar is comprised of photosensitive polyimide.

15 Claims, 4 Drawing Sheets

DIMENSIONALLY DECOUPLED BALL LIMITING METALURGY

FIELD OF THE INVENTION

The present invention relates to a bumping fabrication technology for integrated circuits, and more particularly, to a method for forming bump protective collars on a bumped wafer.

BACKGROUND OF THE INVENTION

Controlled Collapse Chip Connection (C4) techniques have been applied in the semiconductor fabrication industry to facilitate formation of solder bumps on die. The solder bumps serve to connect internal circuitry of a chip with other devices on a circuit board. Chips having solder bumps (e.g. Ball Grid Arrays) are typically placed on a circuit board with robotic "pick and place" equipment. The circuit board is then sent to an oven where the solder is melted to form a permanent electrical connection between the chip and the printed circuit board. In recent years, the electronics industry has been transitioning to lead-free solders for environmental and safety reasons. The switch to lead-free solder creates new challenges for semiconductor fabrication. Therefore, it is desirable to have improved techniques for solder bump fabrication that are better suited to work with lead-free solder materials.

SUMMARY

According to one embodiment of the present invention, a method of forming a ball structure is provided. The method comprises: forming a UBM stack on a substrate, the substrate having a conductor traversing it, wherein the UBM stack is centered over the conductor; forming a protective collar that circumscribes the UBM stack; and forming a solder ball on the UBM stack.

In another embodiment of the present invention, a method of forming a ball structure is provided. The method of forming a ball structure comprises: forming a UBM stack on a substrate, the substrate having a conductor traversing it, wherein the UBM stack is centered over the conductor and formed by: depositing a layer of TiW; depositing a first copper layer; depositing a nickel layer; and depositing a second copper layer, wherein the nickel layer is wider than the first copper layer, thereby forming an undercut area; forming a protective collar that circumscribes the UBM stack and covers the undercut area, thereby protecting it; and forming a solder ball on the UBM stack after the step of forming a protective collar.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

Figure 1:
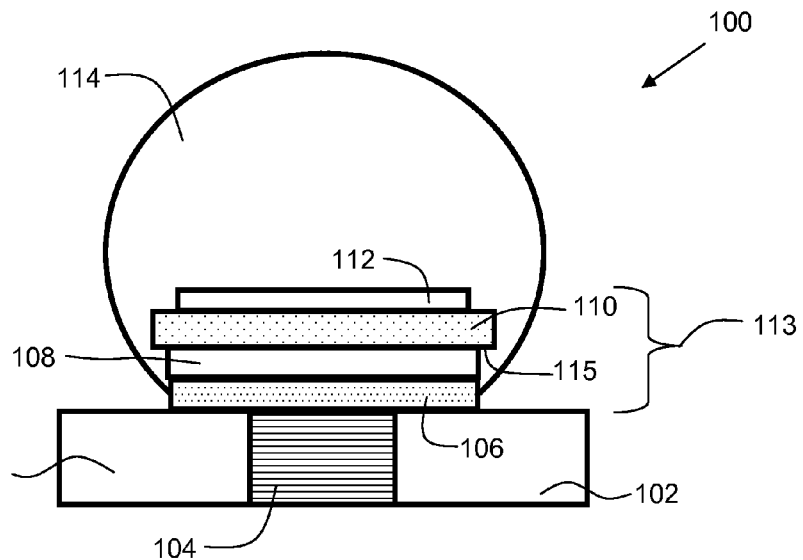
Figure 2:
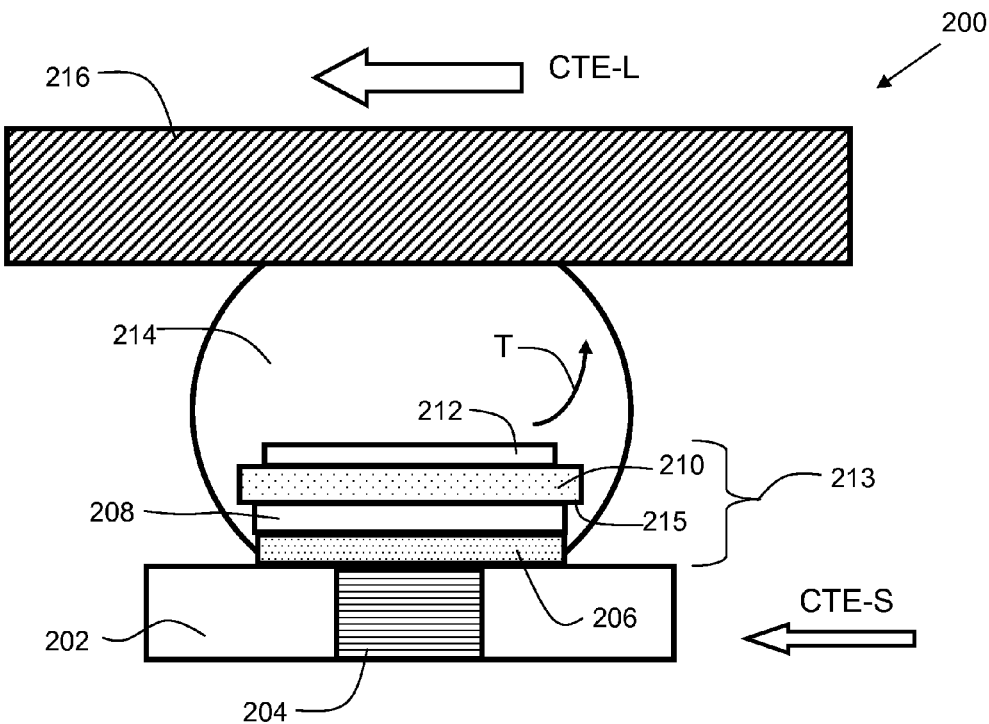
Figure 3:
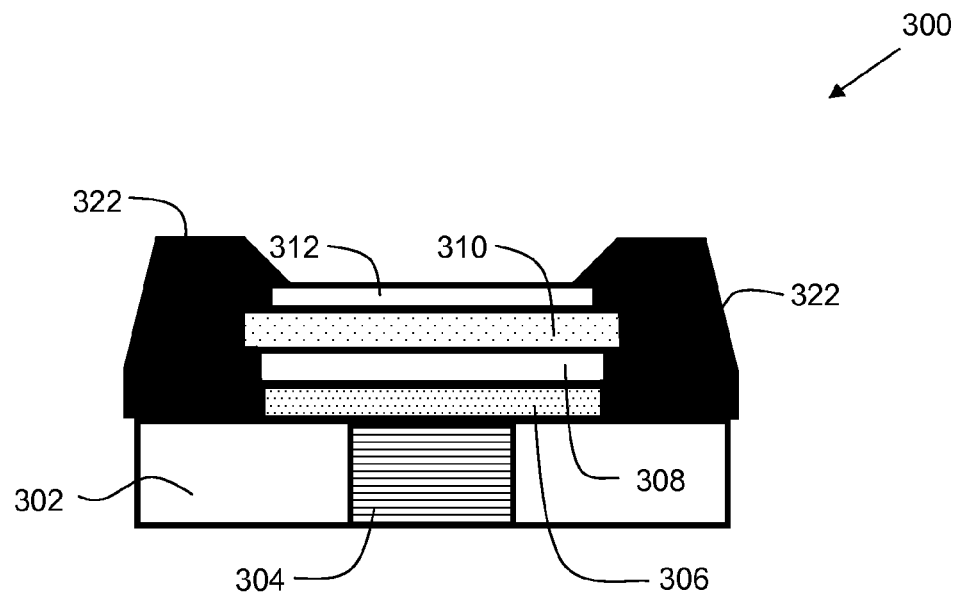
Figure 3B:
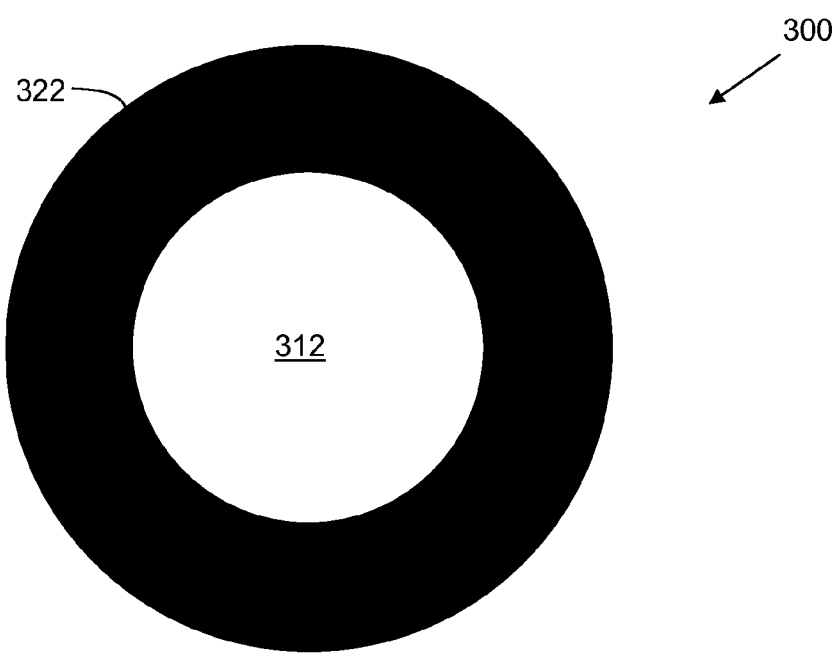
Figure 4:
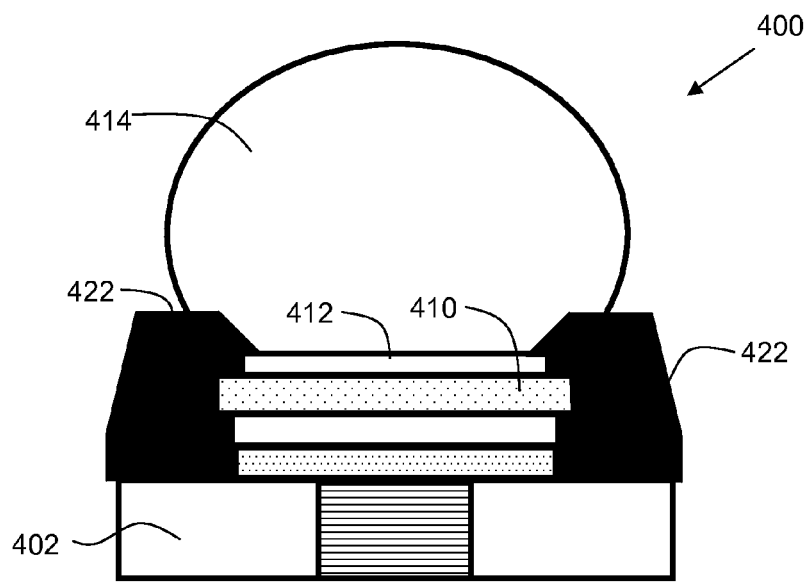
Figure 5:
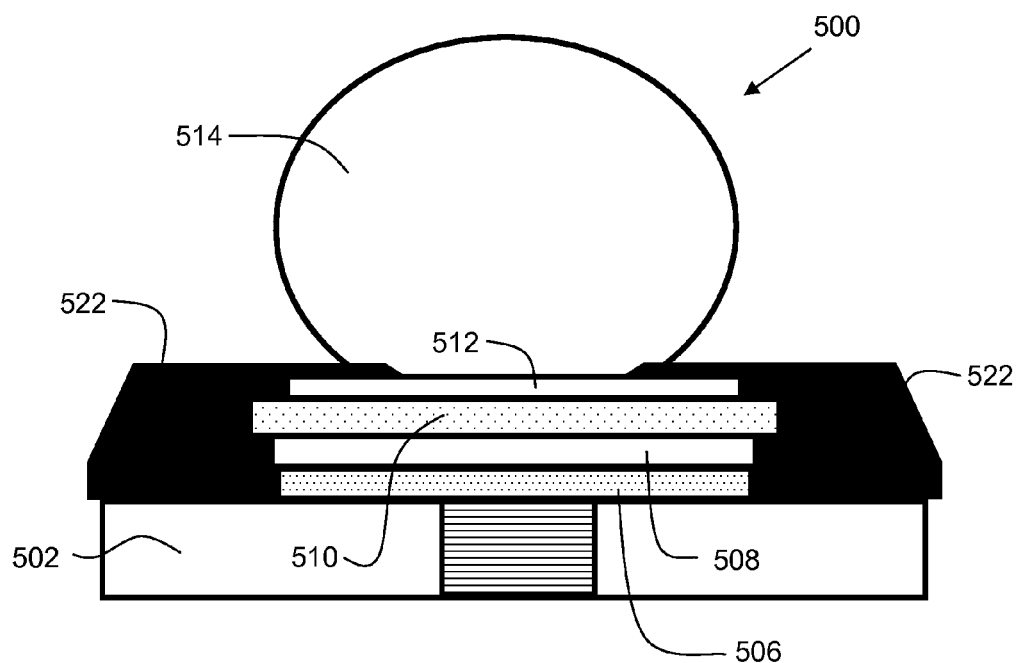
Figure 6:
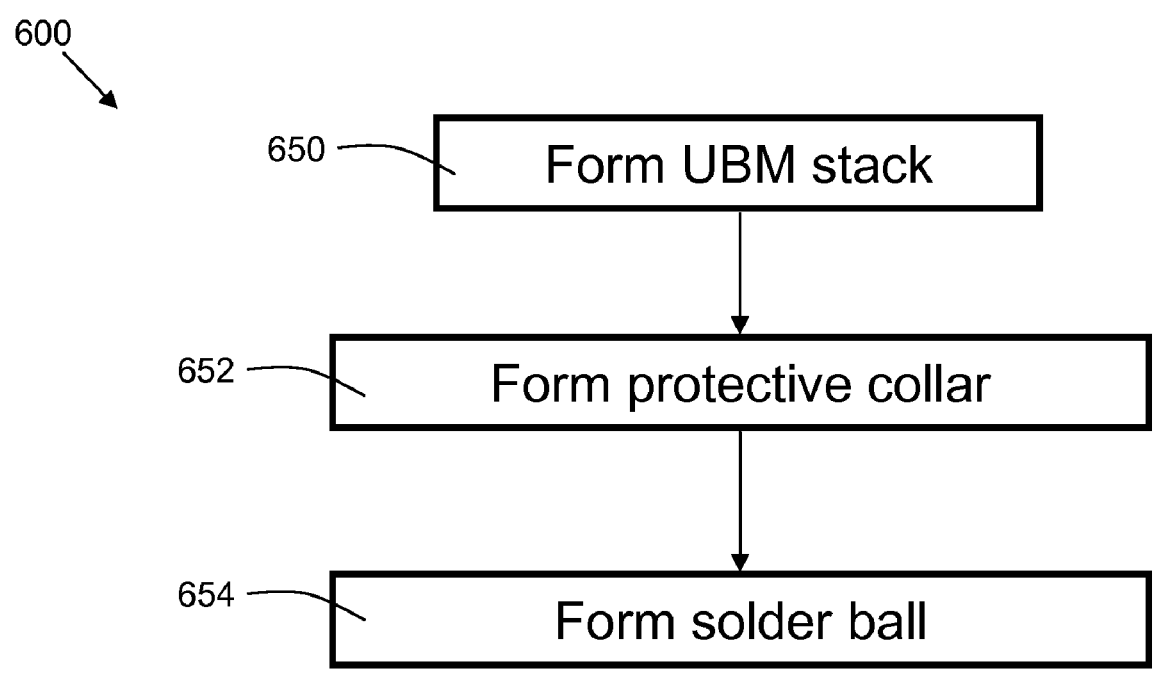

FIG. 1 shows a prior art ball structure.
FIG. 2 shows a prior art ball structure after reflow.
FIGS. 3 and 3B show a structure fabricated according to an embodiment of the present invention.
FIG. 4 shows a ball structure fabricated according to an embodiment of the present invention.
FIG. 5 shows another ball structure fabricated according to an embodiment of the present invention.
FIG. 6 is a flowchart indicating process steps to perform a method according to an embodiment of the present invention.

DETAILED DESCRIPTION

FIG. 1 shows a prior art ball structure 100. Structure 100 comprises substrate 102 which is typically comprised of polyimide, and has conductor 104 disposed within it. Disposed above substrate 102 and in contact with conductor 104 is a TiW (Titanium-Tungsten) compound layer 106. Disposed over layer 106 is sputtered Cu (copper) layer 108. Disposed over layer 108 is electroplated Ni (nickel) layer 110. Disposed over layer 110 is electroplated Cu (copper) layer 112. Disposed over layer 112 is solder ball 114, which is typically a lead-free alloy such as a Sn—Ag alloy (Tin and Silver). Layers 106, 108, 110, and 112 comprise UBM (under-ball metallurgy) stack 113. Layers 106 and 108 may be narrower than layer 110, creating an undercut condition, indicated by 115. The undercut 115 can result from chemical etch of the Cu layer 108 and TiW layer 106, or thermal reaction of the solder ball 114 with the Cu 108 during the solder reflow operation.

During the process of manufacturing a circuit on a printed circuit board, a chip having a plurality of solder balls such as solder ball 114 is placed at the appropriate location on the circuit board such that solder balls on the chip align with corresponding pads (not shown) on the circuit board. The structure 100 is then put through "reflow" which involves putting the structure 100 in a heated environment, such as a furnace to melt the solder ball enough to form a permanent connection to a laminate (circuit board). Typically, the structure is placed in an ambient temperature ranging from 200-300 degrees Celsius for a predetermined time to facilitate the reflow process.

FIG. 2 shows a prior art ball structure 200 after reflow. As stated previously, similar elements may be referred to by similar numbers in various figures (FIGs) of the drawing, in which case typically the last two significant digits may be the same. For example, conductor 204 of FIG. 2 is similar to conductor 104 of FIG. 1. As shown in FIG. 2, solder ball 214 has been reflowed and attached to laminate (e.g. circuit board) 216. The block arrows indicate the relative coefficient of thermal expansion (CTE) values for both the laminate 216 (indicated as CTE-L) and the substrate 202 (indicated as CTE-S). Because CTE-L is larger than CTE-S, the laminate 216 contracts at a higher rate than the substrate 202 as the structure 200 cools after reflow. This causes stress on the solder balls. This stress is more pronounced at solder ball locations that are farther away from the chip center (i.e. locations with a higher DNP (distance to neutral point) have a higher amount of stress on them once the structure 200 has cooled).

In FIG. 2, the laminate 216 is contracting in the direction indicated by the CTE-L arrow (to the left) at a faster rate than the substrate 202. This causes a tensile stress T on the right side of the ball 214, as indicated by the curving upwards arrow (T). This stress can damage layers 206, 208, 210, and 212 (collectively referred to as the UBM (under-ball metallurgy) 213). If the stress is high enough, it can even damage the BEOL (back end of line) structures within the chip. Using acoustic microscopy, the damage caused by these stresses show up in images at small white dots. These dots are sometimes referred to as "white bumps," and are indicative of the stress-induced damage. If solder from solder ball 214 enters the area of the undercut 215 during reflow, it can impart additional stresses on the UBM 213, making it more prone to damage as the structure cools following reflow.

FIG. 3 shows a structure 300 fabricated according to an embodiment of the present invention. Structure 300 has collar 322 surrounding the UBM (layers 306, 308, 310, and 312). Layer 312, comprised of electroplated copper, is optional. In one embodiment, collar 322 is comprised of photosensitive polyimide (PSPI). In another embodiment, collar 322 is comprised of oxide. Another embodiment uses spun-on glass for collar 322. If PSPI is used for the collar 322, then it is preferably formed by applying PSPI in liquid form, then exposing, developing, and curing it to form the solid collar 322. If oxide is used for the collar 322, then it is preferably deposited via chemical vapor deposition (CVD). After the deposition process, collar material is removed from the UBM area to expose layer 312. This may be done with a reactive ion etch (RIE) process.

The collar 322 is concentric with the conductor 304. In one embodiment, the thickness of TiW layer 306 ranges from 900-2100 angstroms, the thickness of sputtered Cu layer 308 ranges from 2900-4100 angstroms, the thickness of Nickel layer 310 ranges from 1.4 micrometers to 3.1 micrometers, and the thickness of second Cu layer 312 ranges from 0.4 to 1.6 micrometers.

FIG. 3B is a top-down view of structure 300, indicating the annular shape of collar 322.

FIG. 4 shows a ball structure 400 fabricated according to an embodiment of the present invention. Structure 400 has ball 414 disposed on electroplated Cu (copper) layer 412 after the formation of collar 422. Ball 414 is bounded by collar 422. This structure, once reflowed to a laminate, imparts reduced stress onto the substrate 402 and other BEOL structures (not shown) because the collar 422 prevents ball solder from seeping into the undercut areas of the UBM.

In one embodiment, the solder ball 414 is a 3 mil SnAg solder bump, meaning that the diameter of the solder ball is about 90 micrometers. In another embodiment, the solder ball diameter may range in size from about 80 micrometers to about 100 micrometers. In one embodiment, solder ball 414 is formed via C4NP (Controlled Collapse Chip Connection New Process). C4NP is a flip chip technology which allows the creation of pre-patterned solder balls to be completed while a wafer is still in the front-end of a manufacturing facility, reducing cycle time significantly. The solder bumps can be inspected in advance and deposited onto the wafer in one simple step using technology similar to wafer-level bonding.

FIG. 5 shows another ball structure 500 fabricated according to an embodiment of the present invention. In structure 500, layers 506, 508, 510, and 512 are considerably longer than that shown in FIG. 4. For example, the width of Ni layer 410 of FIG. 4 is in the range of 90-120 micrometers. In contrast, structure 500 of FIG. 5 has a ball 514 of the same size as 414 of FIG. 4, a 90 micrometer diameter solder bump, but the width of Ni layer 510 is in the range of 130-150 micrometers. Collar 522 is applied to decouple the UBM dimensions from the solder bump dimension, which is beneficial for controlling the CPI (chip-to-package interaction) during the fabrication of a printed circuit board. By extending the UBM to be significantly wider than the diameter of ball 514, the UBM is considerably larger than the area of the ball that contacts the UBM, and is less impacted by solder stresses. The collar 522 also provides support at the base of the solder ball 514, reducing the stresses on various BEOL layers within the chip. In one embodiment, the UBM is 1.3 to 2.5 times the diameter of the ball. In one embodiment, with a 90 micrometer diameter ball, the UBM width (width of Nickel layer) is 140 micrometers.

FIG. 6 is a flowchart 600 indicating process steps to perform a method according to an embodiment of the present invention. In process step 650, the UBM stack is formed, which may comprise the following layers, a TiW layer, a first copper layer, and a nickel layer. Optionally, the UBM stack may further comprise a second copper layer. In process step 652, the protective collar is formed. The collar may be comprised of materials including, but not limited to, PSPI, oxide, and spun-on glass. In process step 654, a solder ball is formed. The solder ball is preferably lead-free, and may comprise a SnAg alloy. The collar seals off the undercut area of the UBM which blocks reflowed solder from the solder ball from entering the undercut area.

As can now be appreciated, embodiments of the present invention provide methods for improving the reliability of circuit fabrication using chips with solder balls.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a ball structure, comprising:
   forming a UBM stack on a substrate, the UBM stack comprised of a plurality of layers, wherein the plurality of layers comprises an undercut condition, the substrate having a conductor traversing it, wherein the UBM stack is centered over the conductor;
   forming an annular protective collar that circumscribes the UBM stack; and
   forming a solder ball on the UBM stack after forming the annular protective collar.

2. The method of claim 1, wherein the step of forming a UBM stack comprises:
   depositing a layer of TiW;
   depositing a first copper layer; and
   depositing a nickel layer.

3. The method of claim 2, further comprising the step of depositing a second copper layer.

4. The method of claim 3, wherein the step of depositing a layer of TiW comprises depositing a TiW layer with a thickness ranging from about 1000 angstroms to about 2000 angstroms.

5. The method of claim 3, wherein the step of depositing a first copper layer comprises depositing a copper layer with a thickness ranging from about 3000 angstroms to about 4000 angstroms.

6. The method of claim 3, wherein the step of depositing a nickel layer comprises depositing a nickel layer with a thickness ranging from about 1.5 micrometers to about 3.0 micrometers.

7. The method of claim 3, wherein the step of depositing a second copper layer comprises depositing a copper layer with a thickness ranging from about 0.5 micrometers to about 1.5 micrometers.

8. The method of claim 1, wherein the step of forming a protective collar comprises forming a photosensitive polyimide collar.

9. The method of claim 3, wherein the step of forming a solder ball on the UBM stack comprises forming a solder ball comprised of a tin-silver alloy.

10. The method of claim 9, wherein the step of forming a solder ball comprises forming a solder ball having a diameter ranging from about 85 micrometers to about 95 micrometers.

11. The method of claim 10, wherein the step of depositing a nickel layer comprises depositing a nickel layer having a width ranging from about 100 micrometers to about 110 micrometers.

12. The method of claim 10, wherein the step of depositing a nickel layer comprises depositing a nickel layer having a width ranging from about 1.4 times the diameter of the solder ball to about 2.4 times the diameter of the solder ball.

13. A method of forming a ball structure, comprising:
   forming a UBM stack on a substrate, the substrate having a conductor traversing it, wherein the UBM stack is centered over the conductor and formed by:
      depositing a layer of TiW;
      depositing a first copper layer;
      depositing a nickel layer; and
      depositing a second copper layer, wherein the nickel layer is wider than the first copper layer, thereby forming an undercut area;
   forming an annular protective collar that circumscribes the UBM stack and covers the undercut area, thereby protecting it; and
   forming a solder ball on the UBM stack after the step of forming a protective collar.

14. The method of claim 13, wherein the step of forming a protective collar comprises forming a photosensitive polyimide collar.

15. The method of claim 13, wherein the step of forming a solder ball on the UBM stack comprises forming a solder ball comprised of a silver-tin alloy.

* * * * *